United States Patent
Yokote et al.

[11] Patent Number: 5,315,544
[45] Date of Patent: May 24, 1994

[54] RADIATION-HARDENED MEMORY STORAGE DEVICE FOR SPACE APPLICATIONS

[75] Inventors: Timothy A. Yokote; Thomas J. Gritzmacher, both of Torrance, Calif.

[73] Assignee: TRW Inc., Redondo Beach, Calif.

[21] Appl. No.: 799,813

[22] Filed: Nov. 29, 1991

[51] Int. Cl.$^5$ .............................. H01L 27/12
[52] U.S. Cl. ...................... 365/154; 357/297; 357/372
[58] Field of Search ............... 365/154; 257/921, 148, 257/156, 297, 345, 372, 376, 523, 612

[56] References Cited

U.S. PATENT DOCUMENTS

| | | | |
|---|---|---|---|
| 4,805,148 | 2/1989 | Diehl-Nagle et al. | 257/297 X |
| 4,866,498 | 9/1989 | Myers | 257/297 |
| 4,931,990 | 6/1990 | Perkin | 365/3 X |
| 4,983,843 | 1/1991 | Thomson | 250/370.02 |
| 5,107,459 | 4/1992 | Chu et al. | 365/63 |

Primary Examiner—Eugene R. LaRoche
Assistant Examiner—Do Hyum Yoo
Attorney, Agent, or Firm—Ronald L. Taylor

[57] ABSTRACT

A radiation-hard dynamic random access memory (DRAM) device having reduced sensitivity to single event upset and latchup. The radiation-hard DRAM device includes a high-density configuration of transistors that have undergone neutron bombardment. The high-density configuration of transistors reduces sensitivity to single event upset, but increases sensitivity to latchup. Neutron bombardment reduces the increased sensitivity to single event latchup to effectively provide permanent latchup immunity.

11 Claims, 1 Drawing Sheet

RADIATION-HARDENED MEMORY STORAGE DEVICE FOR SPACE APPLICATIONS

BACKGROUND OF THE INVENTION

This invention relates generally to memory devices and, more particularly, to solid-state memory devices having reduced sensitivity to single event radiation effects.

Solid-state memory devices are widely used in computers and other electronic devices onboard spacecraft and must be able to operate reliably in the harsh radiation environment of space. Memory devices are generally subjected to two types of radiation effects in space, one caused by overall or total dose radiation and the other by high energy particles. Total dose radiation typically causes slow, overall damage to memory devices, such as aging, and high energy particles cause single event upset and latchup. Single event upset is usually a nondestructive type of event in which a stray charge is deposited in the device, causing one or more of the memory locations to be disrupted. Single event latchup is a potentially destructive type of event in which abnormally high amounts of supply current are drawn by the device, causing loss of data and possible catastrophic damage. A solid-state memory device can be shielded from total dose radiation by a lightweight metal, such as aluminum, but not from high energy particles.

Static random access memory (SRAM) devices have typically been employed as memory storage devices in the space environment because of their reduced sensitivity to radiation effects. However, SRAM's are expensive and, at the present time, cannot be fabricated in dense configurations. Dynamic random access memory (DRAM) devices are much less expensive than SRAM's and can be fabricated in dense configurations. However, DRAM's are much more susceptible to radiation effects than SRAM'S, and have typically employed redundancy to prevent single event upset and external circuitry to detect single event latchup. The external circuitry cuts power to any memory device in which a latchup is detected. The memory device can then be repowered, but the data is lost. Accordingly, there has been a need for a solid-state memory device that is not susceptible to single event radiation effects. The present invention is directed to this end.

SUMMARY OF THE INVENTION

The present invention resides in a radiation-hard dynamic random access memory (DRAM) device having reduced sensitivity to single event upset and latchup. The radiation-hard DRAM device includes a high-density configuration of transistors that have undergone neutron bombardment. The high-density configuration of transistors reduces sensitivity to single event upset, but increases sensitivity to latchup. Neutron bombardment reduces the increased sensitivity to single event latchup to effectively provide permanent latchup immunity.

It will be appreciated from the foregoing that the present invention represents a significant advance in the field of radiation-hard memory devices. Other features and advantages of the present invention will become apparent from the following more detailed description, taken in conjunction with the accompanying drawings, which illustrate, by way of example, the principles of the invention.

DETAILED DESCRIPTION OF THE PREFERRED EMBODIMENT

The present invention resides in a radiation-hard dynamic random access memory (DRAM) device having reduced sensitivity to single event upset and latchup. The radiation-hard DRAM device includes a high-density configuration of transistors that have undergone neutron bombardment. The high-density configuration of transistors reduces sensitivity to single event upset, but increases sensitivity to latchup. Neutron bombardment reduces the increased sensitivity to single event latchup to effectively provide permanent latchup immunity.

Figure 1:
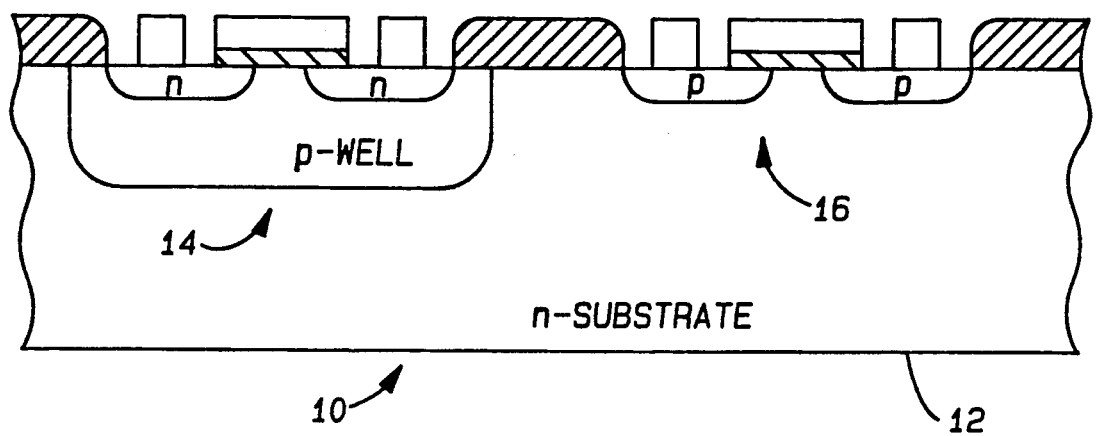
FIG. 1 is a fragmentary sectional view of a pair of complementary metal-oxide semiconductor (CMOS) field-effect transistors.
Figure 2:
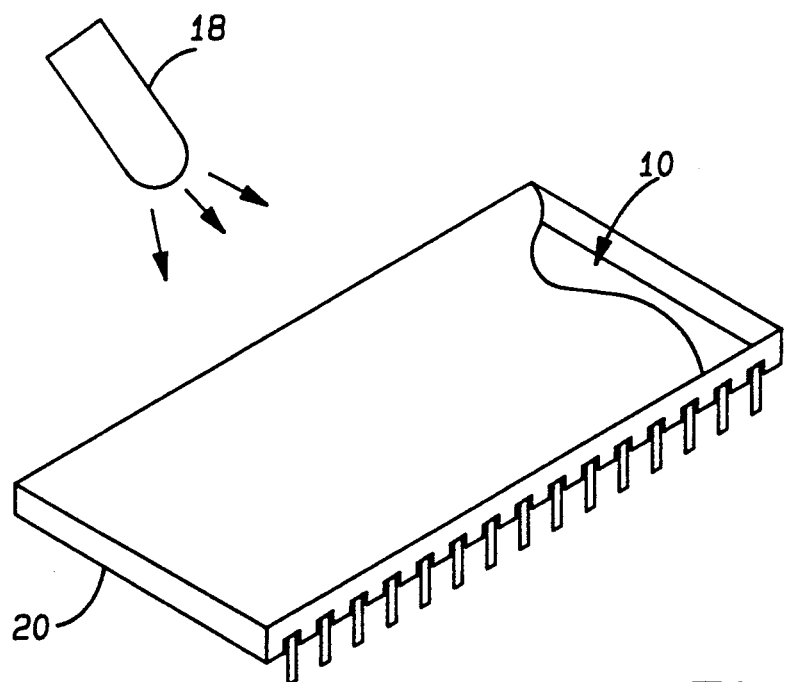
FIG. 2 is a diagrammatic illustration of neutron bombardment of a CMOS DRAM device in accordance with the present invention.

As shown in FIGS. 1 and 2, a presently preferred embodiment of the present invention is a high-density configuration of complementary metal-oxide semiconductor (CMOS) field-effect transistors 10 that have undergone neutron bombardment. FIG. 1 shows a pair of conventional CMOS field-effect transistors formed in a high-density configuration on an n-doped silicon substrate 12. The pair of CMOS transistors includes an n-channel MOS field-effect transistor 14 formed adjacent to a p-channel MOS field-effect transistor 16.

Single event latchup in the CMOS DRAM device 10 is caused by the parasitic P-N-P-N junctions inherent in the device. When stray charges are deposited in the CMOS DRAM device, the parasitic P-N-P-N junctions are activated, causing abnormally high amounts of supply current to be drawn. As shown in FIG. 2, exposing the CMOS DRAM device 10 bombardment by a neutron source 18 at an exposure rate of approximately $10^{14}$ neutrons/cm$^2$, with the device unbiased, dramatically lowers the gain of the parasitic P-N-P-N junctions, providing reduced sensitivity to latchup. As can be appreciated, neutron bombardment according to the invention is substantially higher than naturally occurring neutron bombardment which is less than 10 neutrons/cm$^2$ in space just outside the earth's atmosphere.

To further improve the radiation-hard DRAM of the present invention, the DRAM device 10 is encapsulated in a package 20 fabricated from phenolic-based materials, which do not outgas as much as conventional packages fabricated from epoxy-based resins.

From the foregoing, it will be appreciated that the present invention represents a significant advance in the field of radiation-hard memory devices. Although a preferred embodiment of the invention has been shown and described, it will be apparent that other adaptations and modifications can be made without departing from the spirit and scope of the invention. Accordingly, the invention is not to be limited, except as by the following claims.

We claim:

1. A radiation-hard dynamic random access memory (DRAM) device having reduced sensitivity to single event upset and latchup, comprising:

a high-density configuration of transistors that have been exposed to neutron bombardment substantially higher rate than the rate of naturally occurring neutron bombardment.

2. The radiation-hard DRAM device as set forth in claim 1, wherein the transistors are complementary metal-oxide semiconductor (CMOS) field-effect transistors.

3. The radiation-hard DRAM device as set forth in claim 1, wherein the DRAM device is exposed to neutron bombardment at an exposure rate of approximately $10^{14}$ neutrons/cm$^2$, with the device unbiased.

4. The radiation-hard DRAM device as set forth in claim 2, wherein the DRAM device is exposed to neutron bombardment at an exposure rate of approximately $10^{14}$ neutrons/cm$^2$, with the device unbiased.

5. The radiation-hard DRAM device as set forth in claim 1, wherein the DRAM device is encapsulated in a package fabricated from phenolic-based materials to minimize outgassing.

6. The radiation-hard DRAM device as set forth in claim 2, wherein the DRAM device is encapsulated in a package fabricated from phenolic-based materials to minimize outgassing.

7. A method for storing data in a space environment that reduces sensitivity to single event upset and latchup, comprising the step of:

storing the data in a dynamic random access (DRAM) device having a high-density configuration of transistors that have been exposed to neutron bombardment substantially higher rate than the rate of naturally occurring neutron bombardment.

8. The method for storing data as set forth in claim 7, wherein the DRAM device is exposed to neutron bombardment at an exposure rate of approximately $10^{14}$ neutrons/cm$^2$, with the device unbiased.

9. The method for storing data as set forth in claim 7, wherein the DRAM device is encapsulated in a package fabricated from phenolic-based materials to minimize outgassing.

10. A method for reducing sensitivity of a dynamic random access memory (DRAM) device to single event latchup, comprising the step of:

exposing the DRAM device to neutron bombardment.

11. The method for reducing sensitivity to single event latchup as set forth in claim 10, wherein the DRAM device is exposed to neutron bombardment at an exposure rate of approximately $10^{14}$ neutrons/cm$^2$, with the device unbiased.

* * * * *